(12) United States Patent
Hirano et al.

(10) Patent No.: US 6,818,502 B2
(45) Date of Patent: Nov. 16, 2004

(54) METHOD FOR FORMING CAPACITOR

(75) Inventors: Tomoyuki Hirano, Kanagawa (JP); Hayato Iwamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/774,213

(22) Filed: Feb. 6, 2004

(65) Prior Publication Data

US 2004/0209457 A1 Oct. 21, 2004

Related U.S. Application Data

(62) Division of application No. 09/545,549, filed on Apr. 7, 2000, now Pat. No. 6,712,077.

(30) Foreign Application Priority Data

Apr. 9, 1999 (JP) .......................................... P11-102048

(51) Int. Cl.⁷ ............................................. H01L 21/302
(52) U.S. Cl. ....................... 438/253; 438/694; 438/714; 438/719; 438/734; 134/1.3
(58) Field of Search ................................. 438/253, 694, 438/714, 719, 734; 134/1.3

(56) References Cited

U.S. PATENT DOCUMENTS

| | | | |
|---|---|---|---|
| 6,355,536 B1 * | 3/2002 | Figura et al. ................ | 438/398 |
| 6,368,913 B1 * | 4/2002 | Yamamoto .................. | 438/255 |
| 6,413,833 B2 * | 7/2002 | Yamamoto .................. | 438/398 |
| 6,712,077 B1 * | 3/2004 | Hirano et al. ................ | 134/1.3 |

FOREIGN PATENT DOCUMENTS

| | | | |
|---|---|---|---|
| JP | 09-036320 | * | 2/1997 |
| JP | 11-097641 | * | 4/1999 |
| JP | 11-238863 | * | 8/1999 |

OTHER PUBLICATIONS

"A New Cylindrical Capacitor Using Hemispherical Grained Si (HSG–Si) For 256 Mb DRAMS"; ☐☐International Electron Devices Meeting; Watanabe et. al.; 1992'; pp. 259–262.*

* cited by examiner

*Primary Examiner*—George A. Goudreau
(74) *Attorney, Agent, or Firm*—Sonnenschein, Nath & Rosenthal LLP

(57) ABSTRACT

The invention provides a method for forming a capacitor that enables to form HSG-Si on the entire surface of the exposed surface of a cylindrical bottom electrode. A core pattern is formed on the cylinder core layer on a semiconductor substrate, and an amorphous silicon film is formed so as to cover the core pattern. The amorphous silicon film on the cylinder core layer is removed so that the amorphous silicon film remains on the inside wall of the core pattern, and a bottom electrode comprising the amorphous silicon film is formed on the inside wall of the core pattern. The cylinder core layer that is the component of the core pattern is etching-removed, and then the natural oxide film generated on the surface of the bottom electrode and the amorphous silicon surface layer that is the component of the bottom electrode is etching-removed. Thereafter, HSG-Si is formed on the surface of the bottom electrode.

4 Claims, 7 Drawing Sheets

METHOD FOR FORMING CAPACITOR

CROSS REFERENCE TO RELATED APPLICATIONS

This is a divisional of U.S. application Ser. No. 09/545,549, filed on Apr. 7, 2000 now U.S. Pat. No. 6,712,077, and claims priority to Japanese Application No. P11-102048 filed Apr. 9, 1999, both of which are incorporated herein by reference to the extent permitted by law.

BACKGROUND OF THE INVENTION

1. Field of the Invention

This invention relates to a method for forming a capacitor, and more particularly relates to a method for forming a capacitor in which semispherical silicon grains are formed on the surface of a cylindrical bottom electrode in the fabrication process of a semiconductor device.

2. Description of Related Art

The area that the capacitor occupies is being reduced increasingly in a DRAM (Dynamic Random Access Memory) cell with increasing degree of integration and function of the semiconductor device. On the other hand, to prevent soft error due to α ray in order to render a memory cell functional, it is required to secure the capacitance of a certain level and thereby secure the sufficient margin to the noise. In the technical field of the DRAM cell capacitor, a method in which a ferroelectric film having high dielectric constant is used or a method in which a bottom electrode (namely memory node) formed in the shape of cylinder to increase the surface area is used to increase the capacitance has been applied.

To increase the capacitance the more, Japanese Published Unexamined Patent Application No. Hei 8-306646 proposes a method in which hemispherical grained silicon (referred to as HSG-Si hereinafter) is formed on the surface of an electrode.

A method for forming a cylindrical capacitor to which the above-mentioned method is applied is described herein under.

First, as shown in FIG. 3A, a cylinder core layer 2 consisting of silicon oxide is formed on a substrate 1, and the cylinder core layer 2 is patterned to form a hole core pattern 2a. Next, an amorphous silicon film 3 is formed so as to cover the inside wall of the core pattern 2a, and then the amorphous silicon film 3 on the cylinder core layer 2 is removed partially so as to remain only on the inside wall of the core pattern 2a. As the result, a cylindrical bottom electrode 3a consisting of amorphous silicon is formed. Next, as shown in FIG. 3B, the cylinder core layer 2 on the substrate 1 is removed by means of wet etching.

Next, as shown in FIG. 3C, HSG-Si 5 is formed on the surface of the bottom electrode 3a. At that time, first a natural oxide film (not shown in the drawing) that has grown on the surface of the bottom electrode 3a is removed by means of etching with diluted hydrofluoric acid (DHF). Next, silane gas (SiH$_4$) is fed to the surface of the bottom electrode 3a to form a grained Si film (not shown in the drawing) and then the semifinished product is subsequently annealed. Thereby, silicon atoms migrates to the Si grain nuclei on the amorphous silicon surface that is the component of the bottom electrode 3a. As the result, semispherical silicon grains silicon having the Si grain nucleus at the center namely HSG-Si 5 are formed on the surface of the bottom electrode 3a, and a wide surface area of the bottom electrode 3a is formed.

However, the method for forming a capacitor in which the bottom electrode is formed as described herein above is disadvantageous as described herein under.

In detail, organic substance that is generated during the process is deposited on the surface of the core pattern 2a formed on thee cylinder core layer 2 described with reference to FIG. 3A. Such organic substance is taken into the core pattern 2a side surface layer of the amorphous silicon film 3 formed so as to cover the inside wall of the core pattern 2a. A natural oxide layer that has grown on the surface of the bottom electrode 3a is removed by means of etching of the bottom electrode 3a with diluted hydrofluoric acid, but amorphous silicon that is the component of the bottom electrode 3a and organic substance can not be removed by means of etching with diluted hydrofluoric acid. As the result, the surface layer of the bottom electrode 3a where organic substance has been taken in remains.

Because silicon atoms is prevented from migration on the surface layer (namely amorphous silicon) of the bottom electrode 3a where organic substance has been taken in, the growth of HSG-Si 5 is inhibited. Therefore, the growth of HSG-Si 5 is inhibited on the outer peripheral wall surface of the cylindrical bottom electrode 3a formed as described herein above, the sufficiently wide surface area of the bottom electrode 3a can not be obtained. Such circumstance inhibits the maximization of the capacitance.

SUMMARY OF THE INVENTION

It is the object of the present invention to provides a method for forming a capacitor having a cylindrical bottom electrode on which HSG-Si grows sufficiently on the entire exposed surface to maximize the capacitance.

The present invention has been accomplished to solve the above-mentioned problem, and the first method for forming a capacitor of the present invention involves successive steps as described herein under. In the first step an amorphous silicon film is formed so as to cover hole-type or island-type core pattern formed on a substrate. In the second step the amorphous silicon film is removed so that the amorphous silicon film remains on the side wall of the core pattern to thereby form a cylindrical bottom electrode having the peripheral wall that is the amorphous silicon film remaining on the side wall of the core pattern. In the third step the core pattern is removed by means of etching. In the fourth step the natural oxide film formed on the surface of the bottom electrode and the amorphous silicon surface layer that is the component of the bottom electrode are removed by means of etching. In the fifth step semispherical silicon grains are formed on the surface of the bottom electrode.

In the first method for forming a capacitor in accordance with the present invention, before semispherical silicon grains are formed on the surface of the bottom electrode, not only the natural oxide film on the bottom electrode surface but also the amorphous silicon surface layer that is the component of the bottom electrode is removed. Therefore, contaminant taken into the surface layer of the amorphous silicon film from the side wall of the core pattern is removed together with the amorphous silicon surface layer, and the exposed amorphous silicon surface of the bottom electrode is rendered free from contamination. As the result, the semispherical silicon grains grow sufficiently on the entire surface of the expose surface of the bottom electrode.

In the second method for forming a capacitor in accordance with the present invention, after the same first, second, and third steps as described in claim 1 are carried out to form a cylindrical bottom electrode, and then in the fourth step, the surface layer of the bottom electrode is etched with an aqueous mixture solution containing nitric acid and hydrofluoric acid. Subsequently, in the fifth step semispherical silicon grains are formed on the surface of the bottom electrode.

According to the second method for forming a capacitor in accordance with the present invention, before semispherical silicon grains are formed on the surface of the bottom electrode, the surface layer of the bottom electrode is etched with an aqueous mixture solution containing nitric acid and hydrofluoric acid. In this etching process, the natural oxide film formed on the surface of the bottom electrode is etching-removed with hydrofluoric acid, and the organic contaminant on the surface of the amorphous silicon film taken into from the side wall of the core pattern is etching-removed with nitric acid. Therefore, the exposed amorphous silicon surface of the bottom electrode is rendered free from contamination, and semispherical silicon grains grow sufficiently on the entire surface of the bottom electrode.

DETAILED DESCRIPTION OF THE PREFERRED EMBODIMENT

The preferred embodiments to which the present invention is applied will be described in detail with reference to the drawings.

[First Embodiment]

The first embodiment in which the present invention is applied to a method for forming a capacitor that involves a process for forming a negative-type bottom electrode will be described with reference to process drawings FIGS. 1A to 1G.

Figure 1A:
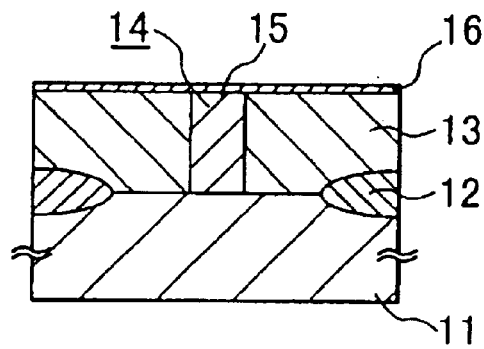
FIG. 1A to FIG. 1G are cross sectional process diagrams for describing the first embodiment and the second embodiment.

First, as shown in FIG. 1A, a field oxide film 12 is formed on the top side of a semiconductor substrate 11, and the top surface of the semiconductor substrate 11 is separated into an active area and field area on which the field oxide film 12 is formed. Next, an inter-layer insulating film 13 is formed on the entire surface of the semiconductor substrate 11 on which the field oxide film 12 has been formed.

Next, the inter-layer insulating film 13 is subjected to anisotropic etching with aid of a resist pattern used as a mask not shown in the drawing to thereby form a contact hole 14 that extends to the semiconductor substrate 11 on the inter-layer insulating film 13. Herein, a diffusion layer formed on the semiconductor substrate 11 just under the contact hole is not shown in the drawing. Then, the resist pattern is removed, and a conductive layer is embedded in the internal of the contact hole 14 to obtain a contact electrode 15 that is connected to the semiconductor substrate 11. Next, an etching stopper layer 116 is formed on the inter-layer insulating film 13 and the contact electrode 14. The etching stopper layer 16 is a layer having a film thickness of, for example, 100 nm consisting of silicon nitride to be served as a stopper layer when a cylinder core layer is removed later.

Figure 1B:
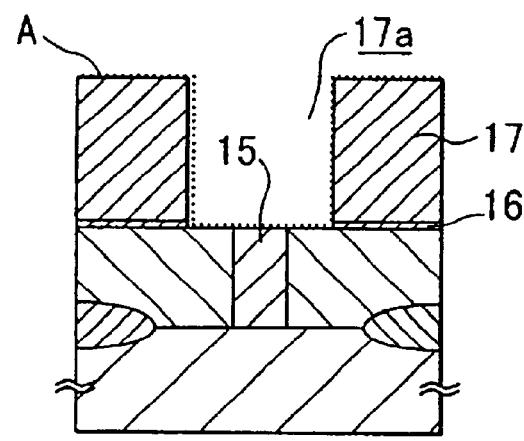

Next, as shown in FIG. 1B, a cylinder core layer 17 having a film thickness of 600 nm consisting of silicon oxide base material is formed on the etching stopper layer 16. Examples of silicon oxide base material of the cylinder core layer 17 include NSG (non-doped silicate glass), BPSG (boro phospho silicate glass), and PSG (phospho silicate glass), and the cylinder core layer 17 is formed by means of LP (low pressure)-CVD (chemical vapor deposition) process with aid of TEOS (tetraethoxy silane) base gas or CVD process with aid of $O_3$ (ozone) gas and TEOS base gas.

The cylinder core layer 17 and etching stopper layer 16 are patterned by means of etching with aid of a resist pattern used as a mask not shown in the drawing to form a hole core pattern 17a so as to expose the contact electrode 15. After etching, the resist pattern is removed.

Figure 1C:
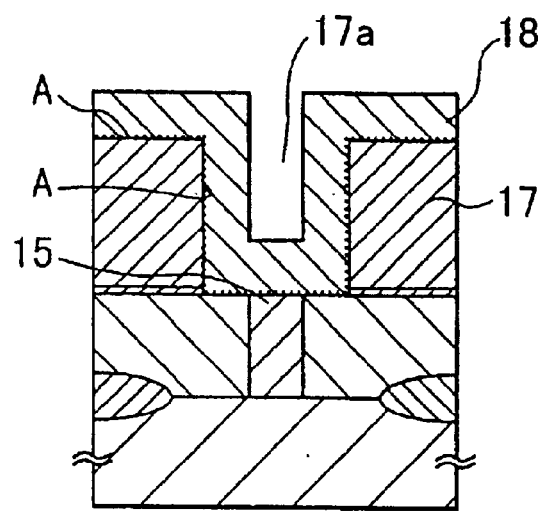

Next, as shown in FIG. 1C, an amorphous silicon film 18 is formed on the: top surface of the cylinder core layer 17 so as to cover the inside wall of the core pattern 17a. An example of a condition for forming the amorphous silicon layer 18 by means of LP-CVD process is shown herein under. Herein, sccm denotes standard cubic centimeter/minutes.

Film forming gas and flow rate:
  silane ($SiH_4$)=1000 sccm
  phosphorus hydride ($PH_3$)=35 sccm
Film forming atmosphere pressure: 150 Pa
Substrate temperature: 530° C.
Film thickness: 100 nm The amorphous silicon film 18 may be formed by use of disilane as the film forming gas. An example of condition for forming the amorphous silicon film by use of disilane is shown herein under.

Film forming gas and flow rate:
  disilane ($Si_2H_6$)=1000 sccm
  phosphorus hydride ($PH_3$)=35 sccm
Film forming atmosphere pressure: 150 Pa
Substrate temperature: 480° C.
Film thickness: 100 nm The amorphous silicon film 18 containing phosphorus (P) that is connected to the contact electrode 15 on the bottom of the core pattern 17a is obtained as described herein above.

Figure 1D:
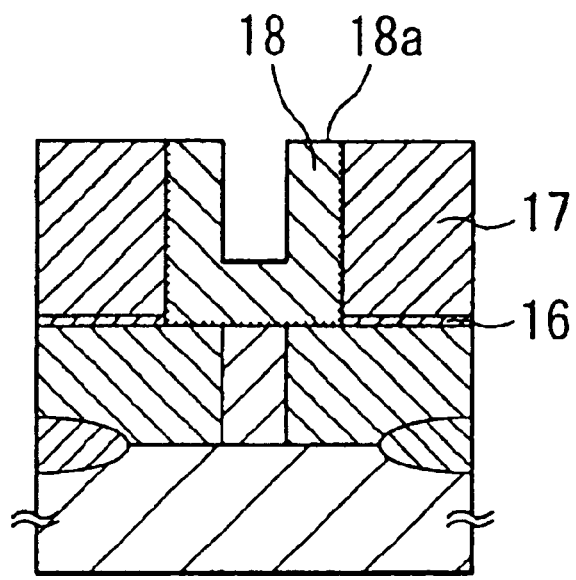

Then, as shown in FIG. 1D, the portion of the amorphous silicon film 18 disposed on the cylinder layer 17 is removed by means of CMP (chemical mechanical polishing) process. Thereby, the cylindrical bottom electrode 18a having the amorphous silicon film 18 that covers only the inside wall of the core pattern 17a is formed.

The amorphous silicon film 18 disposed on the cylinder core layer 17 is removed by means of CMP process in the above-mentioned case, otherwise a method, in which a silicon oxide film (for example, NSG) is formed is formed on the amorphous silicon film 18 at a temperature that is not favorable for crystallization of amorphous silicon, the silicon oxide film and amorphous silicon film 18 are removed by means of isotropic RIE (reactive ion etching) process from the surface side of the silicon oxide film to thereby remove partially the amorphous silicon film 18 excepting the amorphous silicon film 18 that covers the inside wall of the core pattern 17a, may be applied.

Figure 1E:
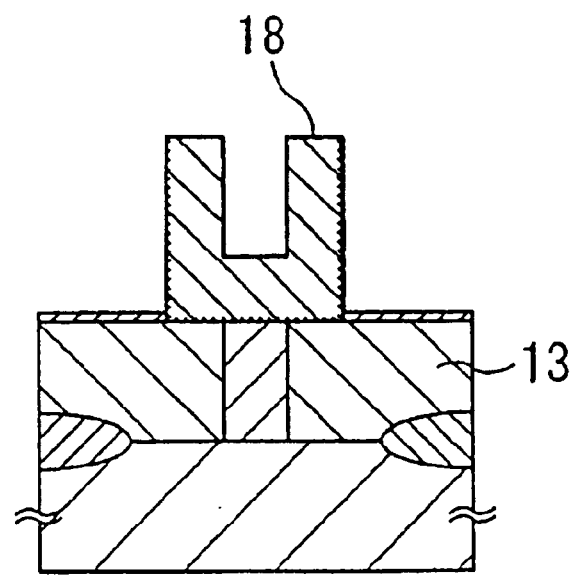

Next, as shown in FIG. 1E, the cylinder core layer 17 consisting of silicon oxide base material is selectively removed by means of wet etching with diluted hydrofluoric acid to remove the core pattern 17a. Thereby, only the bottom electrode 18a consisting of amorphous silicon remains on the inter-layer insulating film 13. In the wet etching process described herein above, for example, a diluted hydrofluoric acid containing fluorine hydride (HF) and water ($H_2O$) in the ratio of 1:20 is used and the etching time is 700 seconds. At that time, because the inter-layer film 13 is covered with the etching stopper layer 16, the inter-layer film 13 is not subjected to etching.

Figure 1F:
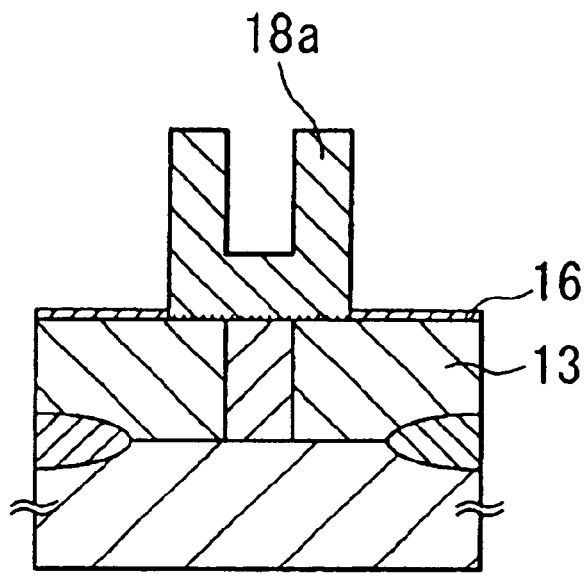

After the above-mentioned process, as shown in FIG. 1F, a natural oxide film (not shown in the drawing) that has grown on the tops surface of the bottom electrode 18a and the exposed amorphous silicon surface layer, which is a component of the bottom electrode 18a, are removed by means of etching. Herein, the natural oxide film (not shown in the drawing) and the exposed amorphous silicon surface layer, which is a component of the bottom electrode 18a, are removed by means of wet etching with strong alkaline aqueous solution etchant. At that time, pH of the strong alkaline aqueous solution is 9 or higher, an aqueous mixture solution containing ammonium fluoride ($NH_4F$) and hydrogen fluoride (HF) in the ratio of 200:1 (by volume) is used, and approximately 5 nm, more preferably approximately 10 nm, thickness of the surface layer of the bottom electrode 18a is removed by means of etching.

A strong alkaline aqueous solutions other than the above-mentioned aqueous mixture solution containing hydrogen fluoride (HF) and ammonium fluoride ($NH_4F$) such as an aqueous mixture solution containing ammonia ($NH_4OH$) and hydrogen peroxide ($H_2O_2$) or an aqueous solution containing potassium hydroxide (KOH) may be used. Otherwise an organic alkaline aqueous solution such as a hydroxylamine ($NH_2OH$) aqueous solution may be used.

Figure 1G:
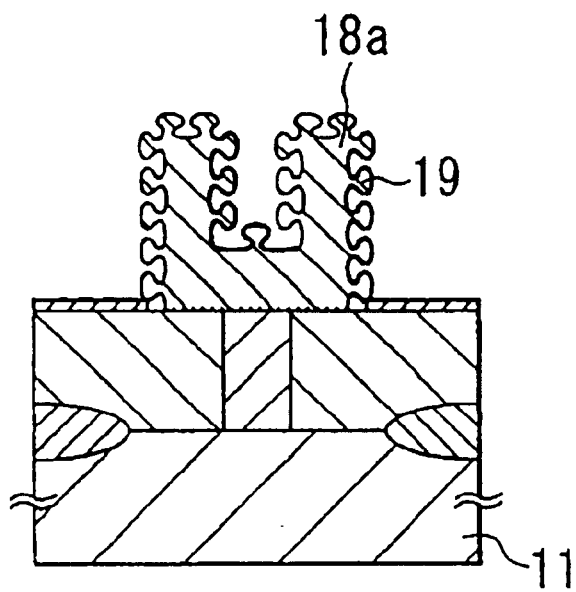

Then, as shown in FIG. 1G, HSG-Si (semispherical silicon grain) 19 is formed on the surface of the bottom electrode 18a. In this case, first the semiconductor substrate 11 on which the bottom electrode 18a has been formed as described herein above is contained in a reaction chamber, and silane gas or disilane gas is fed into the reaction chamber. Thereby, the exposed surface of the bottom electrode 18a is exposed to silane gas or disilane gas, and Si grained film (not shown in the drawing) is selectively formed on the surface of the bottom electrode 18a consisting of amorphous silicon. Next, supply of silane gas or disilane gas is discontinued, and the semifinished product is annealed in the reaction chamber under the condition of ultra-high vacuum or inert gas atmosphere. Thereby, silicon atoms on the amorphous silicon surface that is the component of the bottom electrode 18a migrate to Si grain nuclei, and HSG-Si 19 grows on the surface of the bottom electrode 18a.

Then, a dielectric film is formed so as to cover the bottom electrode 18a on the surface of which HSG-Si 19 is formed, though it is not shown in the drawing, and then a cell plate that is to be served as the top electrode is formed on the dielectric film to complete the capacitor.

In the method for forming the capacitor, not only the natural oxide film on the bottom electrode 18a surface but also the amorphous silicon surface layer that is the component of the bottom electrode 18a is removed before HSG-Si 19 is formed on the surface of the bottom electrode 18a. Therefore, even though contaminant such as organic substance generated during forming process of core pattern 17a is taken into the surface layer when the amorphous silicon film 18 is formed, the organic substance is removed together with the amorphous silicon surface layer by means of etching. As the result, the exposed amorphous silicon surface of the bottom electrode 18a is rendered free from contamination, and it is possible that the HSG-Si 19 grows on the entire surface. HSG-Si 19 grows sufficiently on the entire surface of the expose surface of the bottom electrode 18a without adverse effect of contaminant. As the result, it is possible that the surface area is maximized on the entire exposed surface of the bottom electrode 18a, and the capacitance of the capacitor having the bottom electrode 18a is maximized.

[Second Embodiment]

Next, the second embodiment to which a method for forming a capacitor of the present invention is applied is described. The second embodiment is the same as the first embodiment excepting that the surface layer of the bottom electrode 18a is removed by means of dry etching in the process described with reference to FIG. 1F.

In detail, in the second embodiment, a bottom electrode is formed in the same manner as described with reference to FIG. 1A to FIG. 1E, and then in the process shown in FIG. 1F the natural oxide film (not shown in the drawing) formed on the surface layer of the bottom electrode and the amorphous silicon exposed surface layer that is the component of the bottom electrode 18a are removed by means of dry etching.

An example of dry etching condition is shown herein under.

Etching gas and flow rate:
  methane gas ($CH_4$)=150 sccm
  oxygen gas ($O_2$)=60 sccm
Etching atmosphere pressure: 40 Pa
RF bias: 700 W
Etching time: 14 seconds In this method, as in the case of wet etching with a strong alkaline aqueous solution, because not only the natural oxide film on the surface of the bottom electrode 18a but also the amorphous silicon surface layer that is the component of the bottom electrode 18a is removed by means of etching before HSG-Si 19 grows on the surface of the bottom electrode 118a, the exposed amorphous silicon surface of the bottom electrode 18a is rendered free from contamination. As the result, it is possible that the surface area is maximized on the entire exposed surface of the bottom electrode 18a, and the capacitance of the capacitor having the bottom electrode 18a is maximized as in the case of the first embodiment.

In the process described with reference to FIG. 1F in the above-mentioned first embodiment and second embodiment, a method for removing the natural oxide film (not shown in the drawing) generated on the surface layer of the bottom electrode 18a and the amorphous silicon surface layer that is the component of the bottom electrode 18a by means of etching is described. Otherwise in this process, wet etching with an aqueous mixture solution containing hydrogen fluoride (HF) and nitric acid ($HNO_3$) may be used for removing the surface layer of the bottom electrode 18a.

In the case that the above-mentioned wet etching with an acidic aqueous mixture solution is applied, before HSG-Si 19 is formed on the surface of the bottom electrode 18a, the natural oxide film generated on the surface of the bottom electrode 18a is removed by means etching with hydrofluoric acid, and organic substance on the surface of the amorphous silicon film 18 of the side wall of the core pattern 17a is removed by means of etching with nitric acid. Therefore, the exposed amorphous silicon surface of the bottom electrode 18a is rendered free from contamination. As the result, it is possible that the surface area is maximized on the entire exposed surface of the bottom electrode 18a, and the capacitance of the capacitor having the bottom electrode 18a is maximized as in the case of the first embodiment and the second embodiment.

[Third Embodiment]

In the third embodiment, a method in which the present invention is applied to a method for forming a capacitor having a positive-type bottom electrode will be described with reference to cross sectional process diagrams shown in FIGS. 2A to 2H.

Figure 2A:
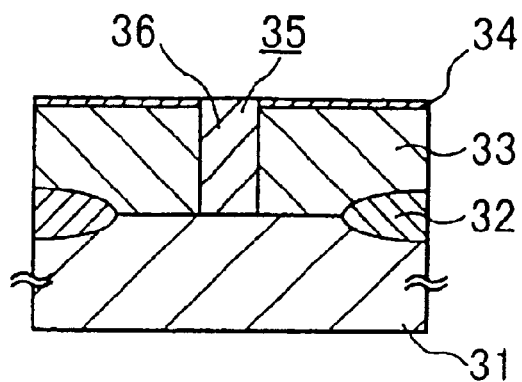
FIG. 2A to FIG. 2H are cross sectional process diagrams for describing the third embodiment.

First, as shown, in FIG. 2A, as in the case of the first embodiment, a field oxide film 32 is formed on the surface side of a semiconductor substrate 31, and the surface side of the semiconductor substrate 31 is separated into an active area and a field area on which the field oxide film 33 is formed. Next, an inter-layer insulating film 33 is formed on the entire surface of the semiconductor substrate 31 on which the field oxide film 32 is formed.

Next, on the inter-layer insulating film 33, an etching stopper layer 34 having a thickness of 100 nm consisting of silicon nitride is formed on the inter-layer insulating film 33. Thereafter, a contact hole 35 is formed on the inter-layer insulating film 33 and the etching stopper layer 34, and a contact electrode 36 is formed by embedded conductive layer in the internal of the contact hole 35.

Figure 2B:
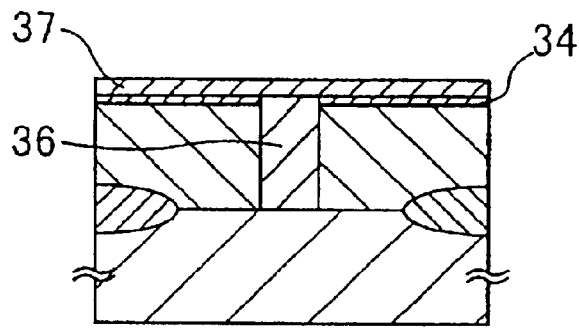

Then, the first amorphous silicon film 37 is formed on the etching stopper layer 34 and the contact electrode 36 by means of LP-CVD process as shown in FIG. 2B. An example of the condition for forming the first amorphous silicon film 37 is shown herein under.

Film forming gas and flow rate:
  silane ($SiH_4$)=1000 sccm
  phosphorus hydride ($PH_3$)=35 sccm
Film forming atmosphere pressure: 150 Pa
Substrate temperature: 530° C.
Film thickness: 100 nm The first amorphous silicon film 37 may be formed by use of disilane gas as the film forming gas. An example of the condition for forming the first amorphous silicon film 37 by use of disilane gas is described herein under.

Figure 2C:
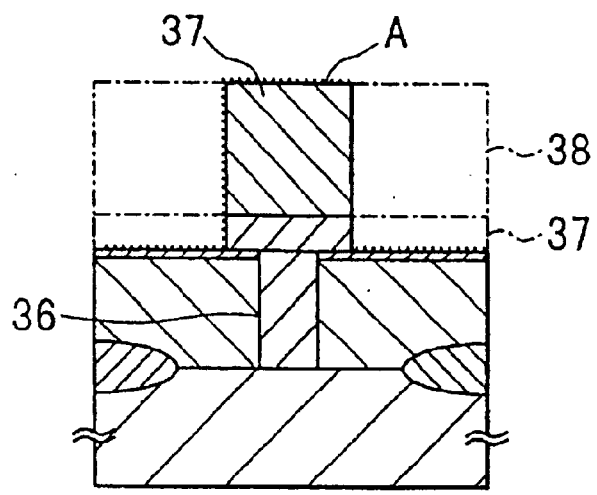

Film forming gas and flow rate:
  disilane ($Si_2H_6$)=1000 sccm
  phosphorus hydride ($PH_3$)=35 sccm
Film forming atmosphere pressure: 150 Pa
Substrate temperature: 530° C.
Film thickness: 100 nm Next, as shown in FIG. 2C, a cylinder core layer 38 consisting of silicon oxide base material having a thickness of approximately 600 nm is formed on the first amorphous silicon film 37. The cylinder core layer 38 is the same as that used in the first embodiment.

Then, the cylinder core layer 38 and the first amorphous silicon film 37 are patterned by means of etching with aid of a resist pattern as a mask not shown in the drawing to thereby form an isolated island core pattern 38a that is the component of the cylinder core layer 38 on the contact electrode 36. The first amorphous silicon film 37 that is to be the bottom of the bottom electrode remains under the bottom of the core pattern 38a. The above-mentioned resist pattern is removed after etching.

Figure 2D:
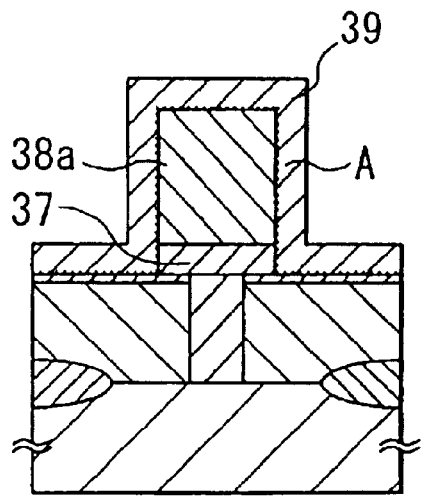

Next, as shown in FIG. 2D, the second amorphous silicon film (namely amorphous silicon film described in claims) is formed so as to cover the core pattern 38a and the first amorphous silicon film 37. The second amorphous silicon film 39 has a thickness of approximately 100 nm, and is formed in the same manner as used for forming the first amorphous silicon film 37.

Figure 2E:
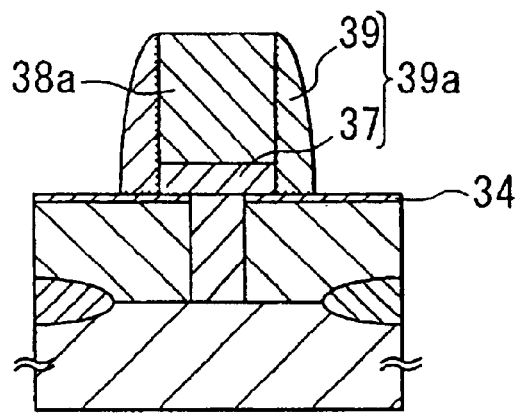

Next, as shown in FIG. 2E, the second amorphous silicon film 39 is etched until the top surface of the core pattern 38a and the etching stopper layer 35 are exposed so that the second amorphous silicon film 39 remains only on the side wall of the core pattern 38a and first amorphous silicon film 37. Thereby, the cylindrical bottom electrode 39a comprising the first amorphous silicon film 37 and the second amorphous silicon film 39 that surrounds the core pattern 38a is formed. The second amorphous silicon film 39 is the peripheral wall of the bottom electrode 39a.

Figure 2F:
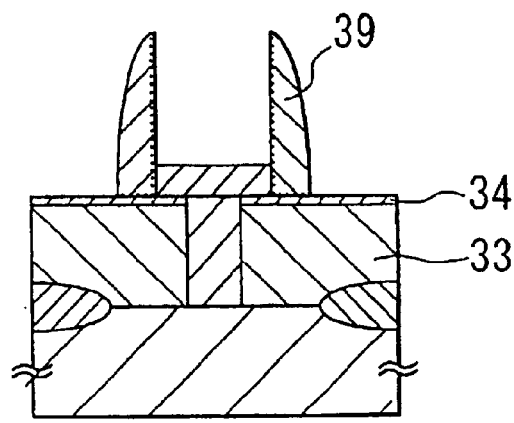

Then, in the process shown in FIG. 2F, the core pattern 38a consisting of silicon oxide base material is selectively removed in the same manner as used in the first embodiment described with reference to FIG. 1E so that only the bottom electrode 39a consisting of amorphous silicon remains on the inter-layer insulating layer 33.

Figure 2G:
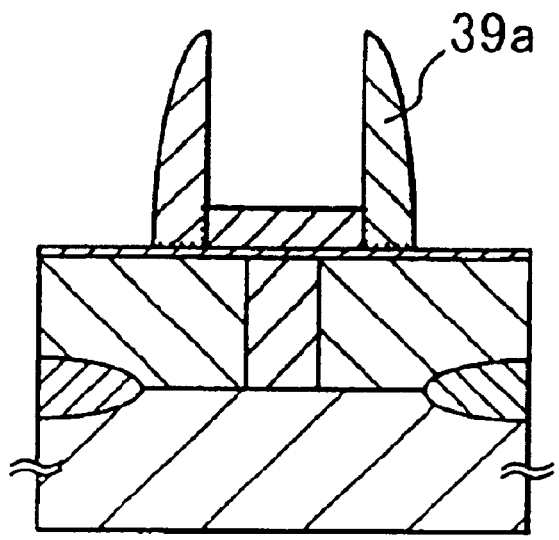

Thereafter, as shown in FIG. FIG. 2G, a natural oxide film (not shown in the drawing) generated on the surface layer of the bottom electrode 39a and the exposed amorphous silicon surface layer that is the component of the bottom electrode 39a are removed by means of etching. Herein, the natural oxide layer (not shown in the drawing) and the exposed amorphous silicon surface layer that is the component of the bottom electrode 39a are removed by means of etching with a strong alkaline aqueous solution etchant. The wet etching is carried out in the same manner as used in the first embodiment described with reference to FIG. 1F.

Figure 2H:
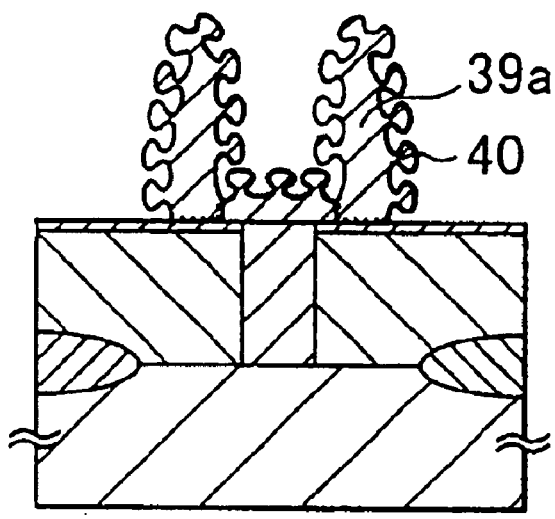
Figure 3A:
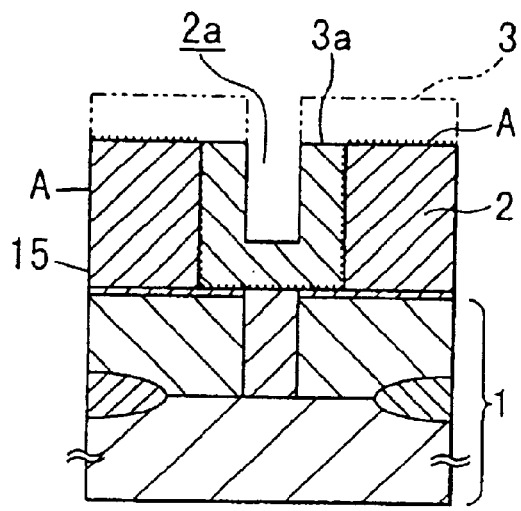
FIG. 3A to FIG. 3C are cross sectional process diagrams for describing a conventional method for forming a capacitor.
Figure 3B:
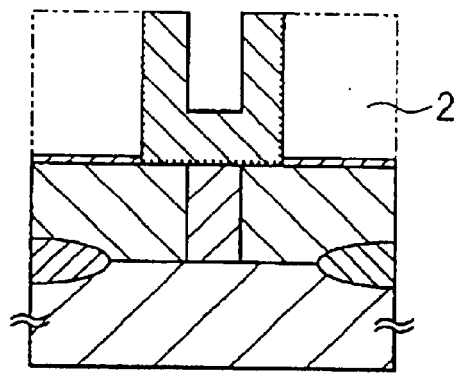
Figure 3C:
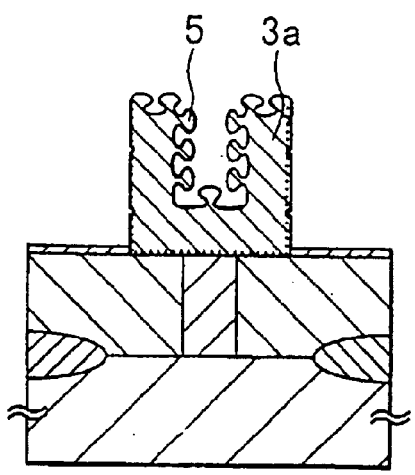

Next, as shown in FIG. 2H, HSG-Si 40 is formed on the surface of the bottom electrode 39a. This process is carried out in the same manner as used in the first embodiment with reference to FIG. 1G.

Thereafter, a dielectric film is formed so as to cover the bottom electrode 39a in the same manner as used in the first embodiment, and then a cell plate that is served to be the top electrode is formed on the dielectric film, and thus the capacitor is completed.

In the above-mentioned method for forming the capacitor, as in the case of the first embodiment, not only the natural oxide film on the bottom electrode 39a surface but also the amorphous silicon surface layer that is the component of the bottom electrode 39a is removed before HSG-Si 40 is formed on the surface of the bottom electrode 39a. Therefore, even though contaminant such as organic substance-generated during forming process of core pattern 38a is taken into the surface layer when the amorphous silicon film 18 is formed, the organic substance is removed together with the amorphous silicon surface layer by means of etching. As the result, the exposed amorphous silicon surface of the bottom electrode 39a is rendered free from contamination, and it is possible that the HSG-Si 40 grows on the entire surface. HSG-Si 40 grows sufficiently on the entire surface of the expose surface of the bottom electrode 39a without adverse effect of contaminant. As the result, as in the case of the above-mentioned first embodiment, it is possible that the surface area is maximized on the entire exposed surface of the bottom electrode 39a, and the capacitance of the capacitor having the bottom electrode 39a is maximized.

In the process described with reference to FIG. 2G in the above-mentioned third embodiment, a method in which the natural oxide film (not shown in the drawing) formed on the surface layer of the bottom electrode 39a and the amorphous silicon surface layer that is the component of the bottom electrode 39a are removed by wet etching with a strong alkaline aqueous solution etching is described. Otherwise, dry etching may be applied in this process as described in the second embodiment. In such case, the same effect as obtained in the third embodiment is also obtained.

In this process, an aqueous mixture solution containing hydrogen fluoride (HF) and nitric acid ($HNO_3$) may be used for etching the bottom electrode 39a. In the case that an acidic aqueous mixture solution is used, the natural oxide film generated on the surface of the bottom electrode 39a is removed by etching with hydrofluoric acid and organic substance on the amorphous silicon film surface is removed by means of etching with nitric acid before HSG-Si 40 is formed on the surface of the bottom electrode 39a. Therefore, the exposed amorphous silicon surface of the bottom electrode 39a is rendered free from contamination, and the same effect as obtained in the third embodiment is also obtained.

As described hereinbefore, according to the first method for forming a capacitor of the present invention, because not only the natural oxide film on the bottom electrode surface but also the amorphous silicon surface layer that is the component of the bottom electrode is removed before semispherical silicon grains are formed on the surface of the bottom electrode, the exposed amorphous silicon surface of the bottom electrode is rendered free from contamination. As the result, semispherical silicon grains grow sufficiently on the entire surface of the expose surface of the bottom electrode, and it is possible that the surface area is maximized on the entire exposed surface of the bottom electrode, and the capacitance of the capacitor having the bottom electrode is maximized.

Furthermore, according to the second method for forming a capacitor of the present invention, because the surface layer of the bottom electrode is etched with an aqueous mixture solution containing nitric acid and hydrofluoric acid before the semispherical silicon grains are formed on the surface of the bottom electrode, the natural oxide film generated on the surface of the bottom electrode is etching-removed with hydrofluoric acid and the organic contaminant on the amorphous silicon surface that is the component of the bottom electrode is etching-removed with nitric acid. Therefore, the exposed amorphous silicon surface of the bottom electrode is rendered free from contamination, and semispherical silicon grains grow sufficiently on the entire surface of the expose surface of the bottom electrode. As the result, it is possible that the surface area is maximized on the entire exposed surface of the bottom electrode, and the capacitance of the capacitor having the bottom electrode is maximized.

What is claimed is:

1. A method for forming a capacitor comprising:

a first step for forming an amorphous silicon film so as to cover hole-type or island-type core pattern formed on a substrate, a second step for removing said amorphous silicon film so that said amorphous silicon film remains on the side wall of said core pattern to thereby form a cylindrical bottom electrode having the peripheral wall that is said amorphous silicon film remaining on the side wall of said core pattern, a third step for removing said core pattern by means of etching, a fourth step for removing the natural oxide film formed on the surface of said bottom electrode and the amorphous silicon surface layer that is the component of said bottom electrode by means of etching, wherein in said fourth step dry etching is applied using $CH_4$ and $O_2$, and a fifth step for forming semispherical silicon grains on the surface of said bottom electrode.

2. The method for forming a capacitor as claimed in claim 1, wherein the core pattern is formed on an etching stopper layer.

3. The method for forming a capacitor as claimed in claim 2, wherein the etching stopper layer is formed on an interlayer insulating film.

4. The method for forming a capacitor as claimed in claim 2, wherein the etching stop layer comprises silicon nitride.

* * * * *